United States Patent [19]

Tonoki et al.

[11] Patent Number: 4,710,420

[45] Date of Patent: Dec. 1, 1987

[54] UNSATURATED POLYESTER RESIN COMPOSITIONS

[75] Inventors: Satoshi Tonoki, Suita; Hidenari Tsunemi, Ohtsu; Asaichi Nishimura, Ohtsu; Kunihisa Abe, Ohtsu, all of Japan

[73] Assignee: Kanegafuchi Kagaku Kogyo Kabushiki Kaisha, Osaka, Japan

[21] Appl. No.: 811,860

[22] Filed: Dec. 20, 1985

[30] Foreign Application Priority Data

Dec. 21, 1984 [JP] Japan .................................. 59-271389
Dec. 21, 1984 [JP] Japan .................................. 59-271390

[51] Int. Cl.$^4$ ....................... B32B 7/02; B32B 27/08; C08F 8/00
[52] U.S. Cl. ................................. 428/212; 428/290; 428/327; 428/480; 428/482; 525/191; 525/209; 525/222
[58] Field of Search ............... 428/246, 212, 480, 290, 428/430, 482, 327; 524/539; 528/230, 287; 525/154, 191, 209, 222, 44, 49

[56] References Cited

U.S. PATENT DOCUMENTS

| | | | |
|---|---|---|---|
| 3,733,370 | 5/1973 | Thompson et al. | 525/44 |
| 4,148,765 | 4/1979 | Nelson | 428/430 X |
| 4,215,032 | 7/1980 | Kobayashi et al. | 524/539 X |
| 4,233,432 | 11/1980 | Curtis, Jr. | 428/482 X |
| 4,309,519 | 1/1982 | Obara et al. | 525/49 X |
| 4,363,907 | 12/1982 | Hefner et al. | 528/287 |
| 4,372,800 | 2/1983 | Oizumi et al. | 428/246 X |
| 4,419,487 | 12/1983 | Rowe | 525/49 X |
| 4,456,737 | 6/1984 | DiDomenico, Jr. | 528/230 X |
| 4,535,127 | 8/1985 | Matsuzaki et al. | 525/154 |

FOREIGN PATENT DOCUMENTS

| | | | |
|---|---|---|---|
| 907245 | 8/1972 | Canada | 528/287 |
| 2073214 | 10/1981 | United Kingdom | 525/222 |

*Primary Examiner*—Thomas J. Herbert
*Attorney, Agent, or Firm*—Armstrong, Nikaido, Marmelstein & Kubovcik

[57] ABSTRACT

An unsaturated polyester resin composition is provided comprising a hard unsaturated polyester component, a soft unsaturated polyester component and a cross-linking monomer. The soft polyester component contains a polyoxyalkylene segment having a molecular weight from 600 to 6000 in the backbone thereof and is dispersed in the hard polyester component forming fine particles having a particle size not greater than 4 microns. The resin composition, when cured, exhibits a Tg corresponding to the hard polyester component from 100° C. to 200° C. and another Tg corresponding to the soft polyester component from −100° C. to 0° C.

30 Claims, No Drawings

UNSATURATED POLYESTER RESIN COMPOSITIONS

BACKGROUND OF THE INVENTION

This invention relates to an unsaturated polyester resin composition for use, in the manufacture of, for example, electrical laminates. The term "electrical laminates" as used herein refers to unclad insulation boards for mounting various electrical and electronic parts thereon as well as one or both sided metal clad laminates for use in the manufacture of printed circuit boards (PCBs).

Electrical laminates made from unsaturated polyester resins are now commercially available and consumed in large quantities. These laminates are produced by a continuous process as disclosed in, for example, U.S. Pat. No. 4,372,800 assigned to the assignee of this application. Unsaturated polyester resins in general find a wide variety of uses owing to their excellent mechanical properties and molding workability with various reinforcing materials. Needs exist for resins having an improved impact strength without compromising their heat resistance in the field of large FRP products. For use in the manufacture of PCBs they must comply with high standard requirements for properties in terms of punching property, solder dip resistance, impact strength and the like. These property requirements have become severer when PCBs are processed on automated basis and densely packaged with parts.

Attempts have been made to improve the impact strength by modifying unsaturated polyester resins with flexible resins, plasticizers, liquid butadiene based polymers, cross-linked diene- or acrylate-based rubbers and the like. However, the incorporation of these modifiers is not satisfactory in that they tend to compromise heat resistance, substrate-impregnating property, stability upon storage without phase separation and other properties of the resulting composition.

It is, therefore, a major object of the present invention to overcome the above-discussed problems. Other objects and advantages thereof will become apparent as the description proceeds.

DESCRIPTION OF THE INVENTION

These objects and advantages are achieved, in accordance with the present invention, by providing an unsaturated polyester resin composition comprising a hard unsaturated polyester component, a soft unsaturated polyester component and a cross-linking monomer, said soft polyester component including a polyoxyalkylene segment having a molecular weight from 600 to 6000 in the backbone thereof and being dispersed in said hard polyester component forming fine particles having a particle size not greater than 0.4 microns, said resin composition exhibiting in its cured state a glass transition temperature corresponding to said hard polyester component from 100° C. to 200° C. and a glass transition temperature corresponding to said soft polyester component from −100° C. to 0° C.

Electrical laminates produced from the resin composition of the present invention exhibit improved impact strength and low-temperature punching properties without compromising heat resistance. Further improvement may be obtained at a particle size of said soft polyester component of not greater than 0.2 microns, most preferably within the range between 0.01 to 0.1 microns.

The hard polyester component used in the present invention may be prepared by reacting an unsaturated polycarboxylic acid, acid anhydride or mixtures thereof optionally containing an unsaturated monocarboxylic acid and/or a saturated polycarboxylic acid with a polyhydric alcohol optionally containing a mono alcohol.

Examples of unsaturated polycarboxylic acids and acid anhydrides include maleic acid, fumaric acid and their acid anhydrides. The term "unsaturated" as used herein means an ethylenic unsaturation present between alpha and beta positions relative to the carboxyl group. Maleic acid dicyclopentadiene monoester (DCPD monomaleate) is an example of unsaturated monocarbocylic acid. Examples of saturated polycarboxylic acid include phthalic acid, isophthalic acid, terephthalic acid, tetrahydrophthalic acid, endic acid, trimellitic acid, pyromellitic acid, tetrabromophthalic acid, dibromoterephthalic acid, chlorendic acid, adipic acid, sebacic acid and acid anhydrides of these acids. The term "saturated" as used herein means the absence of an ethylenic unsaturation between alpha and beta positions relative to the carboxyl group. It is desirable that the sum of unsaturated polycarboxylic acid and unsaturated monocarboxylic acid occupy from 40 to 100 mole % of the total acid reactants.

Examples of polyhydric alcohols includes ethylene glycol, propylene glycol, butanediol, neopentyl glycol, diethylene glycol, hexanediol, hydrogenated bisphenol A, glycerine, trimethylolpropane, pentaerythritol, dibromoneopentyl glycol, adducts of ethylene oxide or propylene oxide with bisphenol A, adducts of ethylene oxide or propylene oxide with tetrabromobisphenol A and bisphenol A epoxide. Examples of monoalcohols include hydroxylated dicyclopentadiene, ethylene glycol monomethyl ether, cinnamyl alcohol, stearyl alcohol, polyethylene glycol monomethyl ether and polypropylene glycol monomethyl ether.

For use in the manufacture of electrical laminates, the hard polyester component may preferably be flame retarded. This may be effected by synthesizing the polyester using halogen-containing acid or alcohol components such as dibromophthalic acid, chlorendic acid, dibromoneopentyl glycol or adducts of ethylene oxide or propylene oxide with tetrabromobisphenol A. Alternatively an unsaturated polyester may be synthesized using as a part of acid and/or alcohol reactants a compound having a double bond to which a halogen molecule may preferentially be added. Thereafter the resulting polyester may be post-halogenated without halogenating ethylenic alpha, beta unsaturation. Examples of such acid and alcohol reactants include DCPD monomaleate, tetrahydrophthalic acid, hydroxylated DCPD and cinnamyl alcohol. In a preferred embodiment, the hard polyester component is prepared by post-brominating an unsaturated polyester including a tetrahydrophthalic acid moiety in the middle of the polymer chain and a DCPD monomaleate moiety at each terminal of the polymer chain.

The soft polyester component used in the present invention may be prepared in the same way as the hard polyester component as discussed above except that the soft polyester component additionally contains an polyoxyalkylene segment having a molecular weight from 600 to 6000 in the backbone thereof. The incorporation of polyoxyalkylene segment may be effected by using as a part of alcohol reactants a polyoxyalkylene monoalcohol and/or a polyoxyalkylene polyol. Examples of polyoxyethylene chains include homopolymers of propylene oxide, copolymers of propylene oxide and ethylene oxide or tetramethylene oxide, and copolymers of ethylene oxide and tetramethylene oxide. Polyoxypropylene diols or triols are most preferable. The soft polyester component may or may not be flame retarded. In a preferred embodiment, the soft polyester component also has a DCPD monomaleate moiety at each terminal.

Examples of cross-linking monomers used in the present invention includes styrene, α-methylstyrene, vinyltoluene, p-methylstyrene, chlorostyrene, divinylbenzene, $C_1$-$C_{10}$ alkyl acrylate, $C_1$-$C_{10}$ alkyl methacrylate, hydroxyalkyl acrylate, hydroxyalkyl methacrylate, diallyl phthalate, triallyl cyanurate and mixtures of these monomers. Styrene is most preferable.

The proportions of hard polyester component, soft polyester component and cross-linking monomer are such that the soft polyester and the cross-linking monomer range from 1-50%, preferably 5 to 25% and 10 to 70%, preferably 20 to 50%, respectively by weight of total amounts of the three components, the balance being the hard polyester component.

The hard polyester component and the soft polyester component may simply form a blend or alternatively chemically linked to each other forming a graft or block copolymer.

The resulting resin composition exhibits in its cured state a glass transition temperature corresponding to the hard polyester component from 100° C. to 200° C. and another glass transition temperature corresponding to the soft polyester component from −100° C. to 0° C. The measurement of glass transition temperature may be carried out, as is well-known, by dilatometry, heat capacity measurement, dynamic dispersion and the like. Its measurement limit usually lies to segment unit (0.05 to 0.015 microns).

The unsaturated resin composition of the present invention may contain conventional additives such as additive type flame retardants, fillers, antioxidants, stabilizers, other polymers, colorant and the like as desired. Examples of additive type flame retardants includes phosphorus based flame retardants such as trioctyl phosphate, triphenyl phosphate, tricresyl phosphate, triethyl phosphite, triphenyl phosphite, tris-(chloroethyl)phosphate and red phosphorus; halogenated flame retardants such as chlorinated paraffin, tetrabromobisphenol A and its derivatives, and tribormophenyl monoglycidyl ether; antimony compounds such as antimony trior pentoxide and sodium antimonate; and other flame retardants such as zinc borate and aluminum hydroxide.

The resin composition of the present invention may be cured using any conventional peroxide catalyst. Examples of preferred peroxide catalysts include peroxy ketals such as 1,1-bis-(t-butylperoxy)-3,3,5-trimethylcyclohexane and 1,1-bis-(t-butylperoxy)cyclohexane; and dialkyl peroxides such as di-t-butylperoxide; and peroxyesters such as t-butylperoxy benzoate. These catalysts may be incorporated in amounts from 0.5 to 2.0 parts per 100 parts by weight of the resin composition. The resin composition may also be cured by irradiating with actinic radiation such as UV radiation, electron beam radiation and other radiation as desired by incorporating an appropriate curing catalyst.

The unsaturated resin composition of the present invention is highly suited for, but not limited to, the production of electrical laminates. In such use, a fibrous substrate or reinforcement is impregnated with the resin composition of the present invention. A plurality of resin-impregnated substrates are combined together optionally with a cladding metal foil being placed on one or both sides and the resulting laminate is cured. The entire operation may preferably be carried out in a continuous mode as described in the hereinbefore cited U.S. Pat. No. 4,372,800. Examples of substrates include glass substrates in the form of cloth, mat or paper; and cellulosic substrates such as kraft paper, or cotton linter paper. Cellulosic substrates pretreated with aminoplast resins are preferable.

The following examples will illustrate the present invention. All parts and percents therein are by weight unless otherwise indicated.

EXAMPLE 1

A one liter flask equipped with stirrer, thermometer, nitrogen gas sparge tube, and distillation column was charged with 198.6 g of DCPD monomaletae, 236.9 g of bis-(3-hydroxypropyl)isophthalate and 39.2 g of maleic anhydride. The reaction was continued under nitrogen gas stream at an inner temperature of 150°-200° C. until an acid number of 13 was reached. The reaction product was allowed to cool. When the temperature was dropped to 160° C., 90 mg of hydroquinone was added. When the temperature was dropped to 100° C., 244 g of styrene was added to obtain hard unsaturated polyester resin (A) having a styrene content of 35%.

Similarly, soft unsaturated polyester resin (B) was prepared by reacting 84.4 g of DCPD monomaleate, 201 g of bis(3-hydroxypropyl)isophthalate, 200.8 g of polypropylene glycol (average M.W.=1181) and 66.6 g of maleic anhydride until an acid number 11 was reached, adding 109 mg of hydroquinone and 229.2 g of styrene to the reaction product. Styrene content was 30%.

50 parts of hard unsaturated polyester resin (A), 50 parts of soft unsaturated polyester resin (B) and 1 part of PERHEXA 3M (organic peroxide curing catalyst sold by Nippon oil & Fats Co., Ltd.) were thoroughly mixed. The resulting resin composition was cast between two glass plates and cured at 110° C. for 1 hour and then at 150° C. for 30 minutes to obtain a cast plate of 3 mm thickness. Properties of this plate are shown in Table 1.

COMPARATIVE EXAMPLE 1

83.5 parts of hard unsaturated polyester resin (A), 13.2 parts of polypropylene glycol (average M.W.=1181) and 1 part of PERHEXA 3M were thoroughly mixed. The resulting resin composition was cast and cured as in Example 1 to obtain a cast plate of 3 mm thickness. Properties of the plate are shown in Table 1.

COMPARATIVE EXAMPLE 2

66.4 g of isophthalic acid, 410.4 g of bis-(2'-hydroxyethoxyethyl)isophthalate and 78.4 g of maleic anhydride were reacted as in Example 1 to an acid number of 30. Styrene was added to the reaction product to obtain unsaturated polyester resin (C) having a styrene content of 35%.

100 parts of unsaturated polyester resin (C) and 1 part of PERHEXA 3M were thoroughly mixed. A cast plate of 3 mm thickness was produced from this resin and properties thereof are shown in Table 1.

TABLE 1

| | | Properties of cast plate | | |
|---|---|---|---|---|
| Test item | Unit | Example 1 | Comparative Ex. 1 | Comparative Ex. 2 |
| Appearance | | Nearly transparent | Opaque | Transparent |
| Average particle size (a) of dispersed soft component | micron | 0.05 | 0.5 | — |
| Tg (b) | °C. | −31 and +145 | −35 and +147 | +62 |
| Flexural modulus (c) at 100° C. | kg/mm$^2$ | 14.1 | 14.9 | 3.1 |
| Dynstat impact (d) strength | kg · cm/cm$^2$ | 6.5 | 2.2 | 3.2 |

(a) Measured by transmission type electron microscope.
(b) Measured by Shimadzu Thermal Analyzer DT-30.
(c) JIS K-6911.
(d) Measured by Dynstat tester No. 500 sold by Toyo Seiki Seisakusho Co., Ltd.

As can be seen from Table 1, the specimen of Example 1 was superior to those of comparative examples in heat resistance and impact strength.

EXAMPLE 2

A kraft paper having a thickness of 285 microns was pretreated with a methnolic solution of methylol melamine and then dried.

This paper substrate was impregnated with the resin composition prepared in Example 1. Five plies of resin-impregnated paper were laminated. The laminate was then cured at 110° C. for 15 minutes and then at 150° C. for 10 minutes to give a cured laminate having a thickness of 1.52 mm. Properties of this laminate are shown in Table 2.

COMPARATIVE EXAMPLE 3

Example 2 was repeated except that the resin composition prepared in Comparative Example 1 was used. Properties of the laminate are shown in Table 2.

COMPARATIVE EXAMPLE 4

Example 2 was repeated except that the resin composition prepared in Comparative Example 2 was used. Properties of the laminate are shown in Table 2.

TABLE 2

| | | Properties of laminate | | |
|---|---|---|---|---|
| Test item | Unit | Example 2 | Comparative Ex. 3 | Comparative Ex. 4 |
| Flexural modulus at 100° C. (a) | kg/mm$^2$ | 305 | 286 | 224 |
| Dynstat impact strength | kg · cm/cm$^2$ | 5.5 | 3.4 | 5.3 |
| Punching property at low temperature (b) | | Good | Not good | Not good |

(a) JIS C-6481
(b) A punching die having a series of ten pins having a diameter of 0.8 mm arranged at an interval of 1.78 mm was used at 25° C. Evaluation was made based on the degree of delamination.

As can been seen from Table 2, the laminate of Example 2 exhibited excellent heat resistance, impact strength and low temperature punching property when comparing with the laminates of Comparative Examples 3 and 4.

EXAMPLE 3

A one liter flask equipped with stirrer, thermometer, nitrogen gas sparge tube and distillation column was charged with 372.4 g of DCPD monomaleate, 73.6 g of maleic anhydride and 97.8 g of ethylene glycol. The reaction was continued under nitrogen gas stream at an inner temperature of 150°–200° C. until an acid number 20 was reached.

After the distillation column was replaced with drip funnel and condenser, methylene chloride was added to the reaction product to prepare a 50% solution. 230 g of bromine was added dropwise over 1 hour while cooling the solution at a temperature below 20° C. in an ice bath. The methylene chloride was distilled off. To the residue were added 283 g of styrene and 0.1 g of hydroquinone to give brominated hard unsaturated polyester resin (D) having a styrene content of 28%.

56 parts of this resin (D), 44 parts of soft unsaturated polyester resin (B) prepared in Example 1 and 1 part of PERHEXA 3M were thorougly mixed. A specimen was prepared from the resulting resin composition as in Example 1. Properties of the specimen were as follows:

| Apperance: | semi-transparent |
|---|---|
| Average particle size of dispersed soft component: | 0.05 microns |
| Tg | −31° C. and +140° C. |
| Flexural modulus at 100° C. | 15.5 kg/mm$^2$ |
| Dynstat impact strength | 5.5 kg · cm/cm$^2$ |

EXAMPLE 4

56 parts of brominated hard unsaturated polyester resin (D) prepared in Example 3, 44 parts of soft unsaturated polyester resin (B) prepared in Example 1, 3.5 parts of antimony trioxide and 1 part of PERHEXA 3M were well kneaded on a roll mill.

A 1.52 mm thickness laminate was produced from the resulting resin composition as in Example 2. The properties of the laminate were as follows:

| Dynstat impact strength | 5.3 kg · cm/cm$^2$ |
|---|---|
| Flexural modulus at 100° C. | 330 kg/mm$^2$ |
| Low temperature punching property | Good |

EXAMPLE 5

A one liter flask equipped with stirrer, thermometer, nitrogen gas sparge tube and distillation column was charged with 298.0 g of DCPD monomaleate, 325.5 g of bis-(2-hydroxyethyl)-tetrahydrophthalate, 69.6 g of fumaric acid, and 0.03 g of hydroquinone. The reaction was continued under nitrogen gas stream at an inner temperature of 140°–190° C. until an acid number 20 was reached. The reaction product was allowed to cool.

After the distillation column was replaced with drip funnel and condenser, methylene chloride was added to the reaction product to prepare a 50% solution. Then 373.5 g of bromine was added dropwise over 1 hour while cooling the solution at a temperature below 20° C. in an ice bath. The methylene chloride was distilled off. To the residue were added 481.7 g of styrene and 0.1 g of hydroquinone to give brominated hard unsaturated polyester resin (E) having a styrene content of 32%.

The same flask as above was charged with 49.2 g of DCPD monomaleate, 289.7 g of bis-(3'-hydroxypropoxypropyl) fumarate, 220.9 g of a reaction product of 3 moles of adipic acid and 1 mole of polyoxypropylene triol having an average M.W. of 2963, 77.9 g of maleic anhydride and 0.06 g of hydroquinone. The reaction was continued under nitrogen gas stream at an inner temperature of 140°–180° C. until an acid number 15 was reached. The reaction product was then allowed to cool. To the reaction product were added 413.2 g of styrene and 0.1 g of hydroquinone to give soft unsaturated polyester resin (F) having a styrene content of 40%.

49 parts of brominated hard unsaturated polyester resin (E), 34 parts of soft unsaturated polyester resin (F), 4 parts of antimony trioxide and 1 part of PERHEXA 3M were well kneaded on a roll mill. A 1.52 mm thickness laminate was prepared from the resulting resin composition as in previous examples and tested on its properties. The laminate exhibited a flexural modulus at 100° C. of 350 kg/mm$^2$, a Dynstat impact strength of 6.0 kg.cm/cm$^2$, an insulation resistance after boiling in water of $1\times10^9$ ohms and a good low temperature punching property.

We claim:

1. An unsaturated polyester resin composition comprising a hard unsaturated polyester component, a soft unsaturated polyester component and a cross-linking monomer, said soft polyester component containing a polyoxyalkylene segment having a molecular weight from 600 to 6000 in the backbone thereof and being dispersed in said hard polyester component forming fine particles having a particle size not greater than 0.4 microns, said resin composition exhibiting in its cured state a glass transition temperature corresponding to said hard polyester component from 100° C. to 200° C. and another glass transition temperature corresponding to said soft polyester component from −100° C. to 0° C.

2. The composition according to claim 1 wherein said hard polyester component is produced by post-brominating an unsaturated polyester having a DCPD monomaleate moiety at each terminal and a tetrahydrophthalic acid moiety in the middle of the polyester chain, and wherein said soft polyester component contains a DCPD monomaleate moiety at each terminal and a polyoxypropylene polyol moiety having a molecular weight from 600 to 6000 in the middle of the polyester chain.

3. The composition according to claim 1 wherein the proportions of said hard polyester component, said soft polyester component and said cross-linking monomer are such that said soft polyester component and said cross-linking monomer occupy 1 to 50% and 10 to 70%, respectively by weight of the sum of these three components, the balance being the hard polyester component.

4. The composition according to claim 1 wherein said hard polyester component is produced by reacting DCPD monomaleate, bis-(2-hydroxyethyl)tetrahydrophthalate, and fumaric acid, and then post-brominating the resulting polyester.

5. The composition according to claim 1 wherein said soft polyester component is produced by reacting DCPD monomaleate, bis-(3'-hydroxypropoxypropyl)-fumarate, polyoxyproplene triol tri-adipate and maleic acid.

6. The composition according to claim 1 wherein said particle size is not greater than 0.2 microns.

7. The composition according to claim 6 wherein said particle size lies between 0.01 and 0.1 microns.

8. The composition according to claim 1 wherein said hard polyester component contains a DCPD monomaleate moiety at each terminal.

9. The composition according to claim 8 wherein said DCPD monomaleate moiety is post-brominated to render the composition flame retarded.

10. The composition according to claim 8 wherein said hard polyester component contains a tetrahydrophthalic acid moiety in the middle of the polyester chain.

11. The composition according to claim 10 wherein said DCPD moiety and said tetrahydrophthalic acid moiety are post brominated to render the composition flame retarded.

12. The composition according to claim 1 wherein said soft polyester component contains a DCPD monomaleate moiety at each terminal.

13. The composition according to claim 12 wherein said soft polyester component contains a polyoxypropylene polyol moiety having a molecular weight from 600 to 6000 in the middle of the polyester chain.

14. An electrical laminate comprising at least two layers of a fibrous substrate impregnated with the resin composition of claim 1.

15. An electrical laminate comprising at least two layers of a fibrous substrate impregnated with the resin composition of claim 2.

16. An electrical laminate comprising at least two layers of a fibrous substrate impregnated with the resin composition of claim 4.

17. An electrical laminate comprising at least two layers of a fibrous substrate impregnated with the resin composition of claim 5.

18. An electrical laminate comprising at least two layers of a fibrous substrate impregnated with the resin composition of claim 8.

19. An electrical laminate comprising at least two layers of a fibrous substrate impregnated with the resin composition of claim 11.

20. An electrical laminate comprising at least two layers of a fibrous substrate impregnated with the resin composition of claim 13.

21. An unsaturated polyester resin composition comprising a hard unsaturated polyester component, a soft unsaturated polyester component and a cross-linking monomer, said soft polyester component containing a polyoxyalkylene segment having a molecular weight from 600 to 6000 in the backbone thereof, said hard polyester component being free from said polyoxyalkylene segment.

22. The composition according to claim 21 wherein said soft polyester component contains said polyoxyalkylene segment in an amount from 25 to 75% by weight of the soft polyester component.

23. The composition according to claim 21 wherein the content of said polyoxyalkylene segment ranges from 5 to 30% by weight of the entire composition.

24. The composition according to claim 21 wherein said hard polyester component and said soft polyester component form a polymer blend.

25. The composition according to claim 21 wherein said hard polyester component and said soft polymer component are chemically linked to each other.

26. An electrical laminate comprising at least two layers of a fibrous substrate impregnated with the resin composition of claim 21.

27. An electrical laminate comprising at least two layers of a fibrous substrate impregnated with the resin composition of claim 22.

28. An electrical laminate comprising at least two layers of a fibrous substrate impregnated with the resin composition of claim 23.

29. An electrical laminate comprising at least two layers of a fibrous substrate impregnated with the resin composition of claim 24.

30. An electrical laminate comprising at least two layers of a fibrous substrate impregnated with the resin composition of claim 25.

* * * * *